United States Patent [19]

Lee, Jr. et al.

[11] Patent Number: 5,525,898
[45] Date of Patent: Jun. 11, 1996

[54] PROGRAMMABLE MULTI-CHANNEL LOAD PROFILE RECORDER AND METHOD OF RECORDING ELECTRICAL ENERGY METERING QUANTITIES THEREIN

[75] Inventors: Robert E. Lee, Jr., Ocala, Fla.; Gregory P. Lavoie, Lee, N.H.

[73] Assignee: General Electric Company, New York, N.Y.

[21] Appl. No.: 357,600

[22] Filed: Dec. 16, 1994

[51] Int. Cl.⁶ .............................. G01R 7/00; G01R 11/32
[52] U.S. Cl. ............................................ 324/142; 324/113
[58] Field of Search ................................ 324/103 R, 116, 324/113, 142; 364/483, 492; 340/870.02

[56] References Cited

U.S. PATENT DOCUMENTS

| | | | |
|---|---|---|---|
| 4,509,128 | 4/1985 | Coppola et al. | 324/103 R |
| 5,315,235 | 5/1994 | Atherton et al. | 324/116 |
| 5,459,459 | 10/1995 | Lee, Jr. | 340/870.02 |
| 5,469,153 | 11/1995 | Atherton et al. | 340/870.02 |

OTHER PUBLICATIONS

GE Bulletin GEA–11969, *The Phase3 Electronic Polyphase Meter*, Feb. 1991.
A. W. Leigh, *A Simple Real–Time Operating System, Real Time Software for Small Systems*, Sigma Press, 1988, pp. 59–81.
GE Bulletin GEA–11675A, *Expanding the Limits of Interval Demand Recording*, Aug. 1988.
GE Bulletin GEA 11753, *The General Electric Universal Reader*, Oct. 1987.
GE Bulletin GEA–11700, *Today's Most Advanced Electronic Metering System*, Dec. 1986.
GE Bulletin GEA–11603, *The TM–91 TOU Self–Reading Register*, Dec. 1985.

*Primary Examiner*—Ernest F. Karlsen
*Assistant Examiner*—Russell M. Kobert
*Attorney, Agent, or Firm*—Bell Seltzer Park and Gibson

[57] ABSTRACT

A programmable multi-channel load profile recorder includes a plurality of memory-based tables, such as a load profile configuration table, a plurality of channel and display configuration tables and an operations table, which can be updated when the recorder is reprogrammed in the field to record additional channels of metering quantities or reconfigured with new formulas. The load profile configuration table containing entries therein for each of a plurality of user-selected metering quantities to be recorded. The plurality of channel and display configuration tables contain parameter data and the operations table contains pointers therein to respective memory-based operation modules, each of which contains executable instructions therein. The metering quantities can be quantities such as watt-hours (Wh), var-hours (Vh), volt-ampere-hours (VAh), volt²-hours ($V^2h$), ampere²-hours ($A^2h$) and power factor (PF) as well as other user-selected quantities. According to a preferred aspect of the present invention, each of the tables and modules can be readily updated based on externally supplied data at the time the recorder is programmed. Thus, the recorder need not contain built-in data for determining all the possible channel combinations which might be selected by a user, or fixed formulas for determining all possible metering quantities. The display configuration tables are also provided in memory so that displayable quantities such as RMS line voltage ($V_{rms}$) can be displayed by the recorder, even if such quantity is not one of the above-described metering quantities.

16 Claims, 5 Drawing Sheets

| TABLE | ENTRY | BYTES | VALUE |
|---|---|---|---|
| LPC TABLE | 0 | 0 | NUMBER OF CHANNELS (0-255) |
| | 1 | 1 | CHANNEL 1 CONFIGURATION SUBTABLE/POINTER |
| | 2 | 1+Y | CHANNEL 2 CONFIGURATION SUBTABLE/POINTER |
| | ...... | | |
| | N | 1+(N-1)Y | CHANNEL N CONFIGURATION SUBTABLE/POINTER |

| TABLE | ENTRY | BYTES | VALUE |
|---|---|---|---|
| CC TABLE | 0 | 0 | POINTER TO OP TABLE/OP MODULE |
| | 1 | 1 | NUMBER OF PARAMETERS |
| | 2 | 2 | PARAMETER #1 LENGTH |
| | 3 | 3 | PARAMETER #1 FORMAT |
| | 4 | 4-6 | PARAMETER #1/PARAMETER #1 POINTER |
| | 5 | 7 | PARAMETER #2 LENGTH |
| | 6 | 8 | PARAMETER #2 FORMAT |
| | 7 | 9-11 | PARAMETER #2/PARAMETER #2 POINTER |
| | ...... | | |
| | 3(N-1)+2 | 2+(N-1)5 | PARAMETER #N LENGTH |
| | 3(N-1)+3 | 3+(N-1)5 | PARAMETER #N FORMAT |
| | 3(N-1)+3 | 4+(N-1)5 | PARAMETER #N/PARAMETER #N POINTER |

*FIG. 4A*

PROGRAMMABLE MULTI-CHANNEL LOAD PROFILE RECORDER AND METHOD OF RECORDING ELECTRICAL ENERGY METERING QUANTITIES THEREIN

CROSS REFERENCE TO RELATED APPLICATIONS

This application is related to U.S. patent application Ser. No. 08/357,583, filed Dec. 16, 1994, now pending, entitled METHOD OF GENERATING ELECTRICAL ENERGY METERING QUANTITIES IN A MULTI-CHANNEL LOAD PROFILE RECORDER (Attorney Docket No. 4958-65), filed concurrently herewith, the disclosure of which is hereby incorporated herein by reference.

FIELD OF THE INVENTION

The present invention relates to electrical energy usage, and more particularly to an electrical energy usage recording apparatus and method of recording electrical energy usage therein.

BACKGROUND OF THE INVENTION

In the distribution of electrical energy, electric utility companies have typically found it desirable to measure not only real load energy as watthours delivered to a user, but also, reactive load quadergy as varhours (or reactive volt-ampere hours), apparent energy and power factor. By measuring both watthours and varhours, electric utilities can more accurately apportion the costs of supplying energy to customers having varying demands and loads. Furthermore, because the capacity of the distribution network for delivering electrical energy to consumers is a function of the apparent energy as volt-ampere-hours and not just the real or reactive components thereof, electric utility companies typically desired that electrical energy meters simultaneously maintain time-based records of apparent energy, power factor and other "derived" load profile metering quantities, in addition to watthour and varhour usage. These records are typically generated internal to the meter, at the periodic completion of consecutive load profile time intervals. An example of a meter with record keeping capability is the Phase 3i™ Electronic Meter with KRC-901™ Recording Register, which is publicly available from General Electric Company, Somersworth, N.H. Dedicated recording registers having up to 32K bytes of memory for retaining multiple channels of load profile data are also publicly available. For example, the General Electric TMR-900i™ Recording Register can compile up to fifty-four (54) days of data at five (5) minute intervals.

However, while electric utility companies typically agree on the definition and formulas to be used in generating basic metering quantities such as watt-hours (Wh), var-hours (VARh), the formulas used to calculate quantities such as volt-ampere-hours (VAh) and power factor (PF) can differ from one electric utility to another. In addition, it is possible that new and/or additional metering quantities may also be desired by an electric utility company once a meter has been installed in the field. Thus, notwithstanding the fact that the above described meters and dedicated recorders are capable of accumulating load profile data for a plurality of channels and for extended periods of time, there continues to be a need for a multi-channel load profile recorder which can be reprogrammed in the field to record new and additional metering quantities.

SUMMARY OF THE INVENTION

It is therefore an object of the present invention to provide a programmable multi-channel load profile recorder, and method of recording electrical energy metering quantities therein.

It is another object of the present invention to provide a multi-channel load profile recorder which can be readily programmed in the field to record a fewer or greater number of electrical energy metering quantities.

It is a further object of the present invention to provide a multi-channel load profile recorder which can be updated with new formulas so that utility companies can reconfigure their recorders based on their preferred techniques for determining load profile interval data.

These and other objects, features and advantages are provided, according to the present invention, by a programmable multi-channel load profile recorder containing a plurality of memory-based tables, such as a load profile configuration table, a plurality of channel configuration tables and an operations table, which can be updated when the recorder is reprogrammed to record additional channels or reconfigured with new formulas. The present invention includes a load profile configuration table containing entries therein for each of a plurality of user-selected metering quantities to be recorded, a plurality of channel configuration tables containing parameter data, and an operations table containing pointers therein to respective memory-based operation modules, each of which contains executable instructions therein corresponding to the formulas. These metering quantities can be quantities such as watt-hours (Wh), varhours (Vh), volt-ampere-hours (VAh), volt$^2$-hours (V$^2$h), ampere$^2$-hours (A$^2$h) and power factor (PF) as well as other user-selected quantities. According to a preferred aspect of the present invention, each of the tables and modules can be readily updated based on externally supplied data at the time the recorder is programmed. Thus, the recorder need not contain built-in data for determining all the possible channel combinations which might be selected by a user, or fixed formulas for determining all possible metering quantities.

In particular, the present invention includes a load profile configuration table having entries therein corresponding to each of the plurality of preselected electrical energy metering quantities to be recorded. The entries may contain the channel configuration tables as sub-tables or the entries may be pointers (i.e., addresses) to the channel configuration tables. The channel configuration tables contain entries therein for retaining parameter data corresponding to the numeric parameters used in determining the metering quantities (e.g., format and length data for each numeric parameter). The channel configuration tables may also contain the numeric parameters as entries or pointers to those numeric parameters in separate memory locations. In addition, the channel configuration tables contain pointers to entries in an operations table. Preferably, the operations table also contains pointers to respective ones of the operation modules. The operation modules contain microprocessor-executable instructions which are executed upon completion of each load profile time interval so that the metering quantities can be determined from, among other things, the parameter data and the numeric parameters.

According to another aspect of the present invention, a display configuration table(s) is provided in memory so that a displayable quantity such as RMS line voltage ($V_{rms}$) can be displayed by the recorder, even if such quantity is not one of the above-described metering quantities. In particular, the display configuration table includes entries therein for retaining parameter data to be used in determining a desired displayable quantity and for retaining a pointer to one of the entries in the operations table or one of the plurality of operation modules. The recorded metering quantities may also be displayable quantities.

The method according to the present invention includes the steps of accessing the plurality of channel configuration tables in memory to obtain parameter data corresponding to the plurality of metering quantities being recorded and obtain pointers to entries in the operations table. These entries in the operations table are also accessed to obtain pointers to memory-based operations modules. The instructions in the operations modules are then executed upon completion of each load profile time interval. During this step, the parameter data and numeric parameters are used so that the plurality of electrical energy metering quantities can be determined.

BRIEF DESCRIPTION OF THE DRAWINGS

FIG. 4A and FIG. 4B illustrate a load profile configuration table, a channel configuration table, an operations table, operation modules and a display configuration table, according to the present invention.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
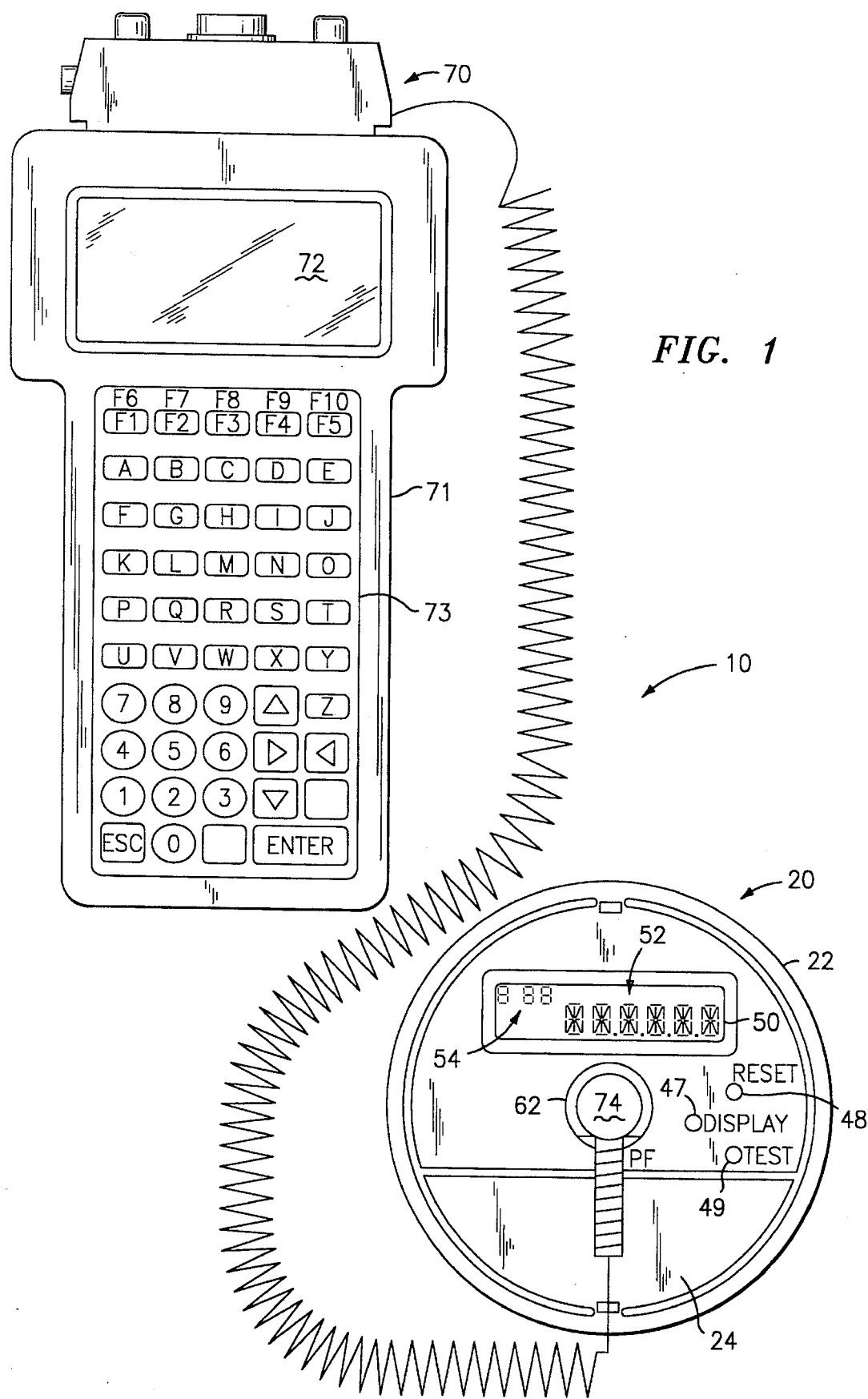
FIG. 1 is a front perspective view of an electrical energy recording system containing a programmable multi-channel load profile recorder according to the present invention.
Figure 2:
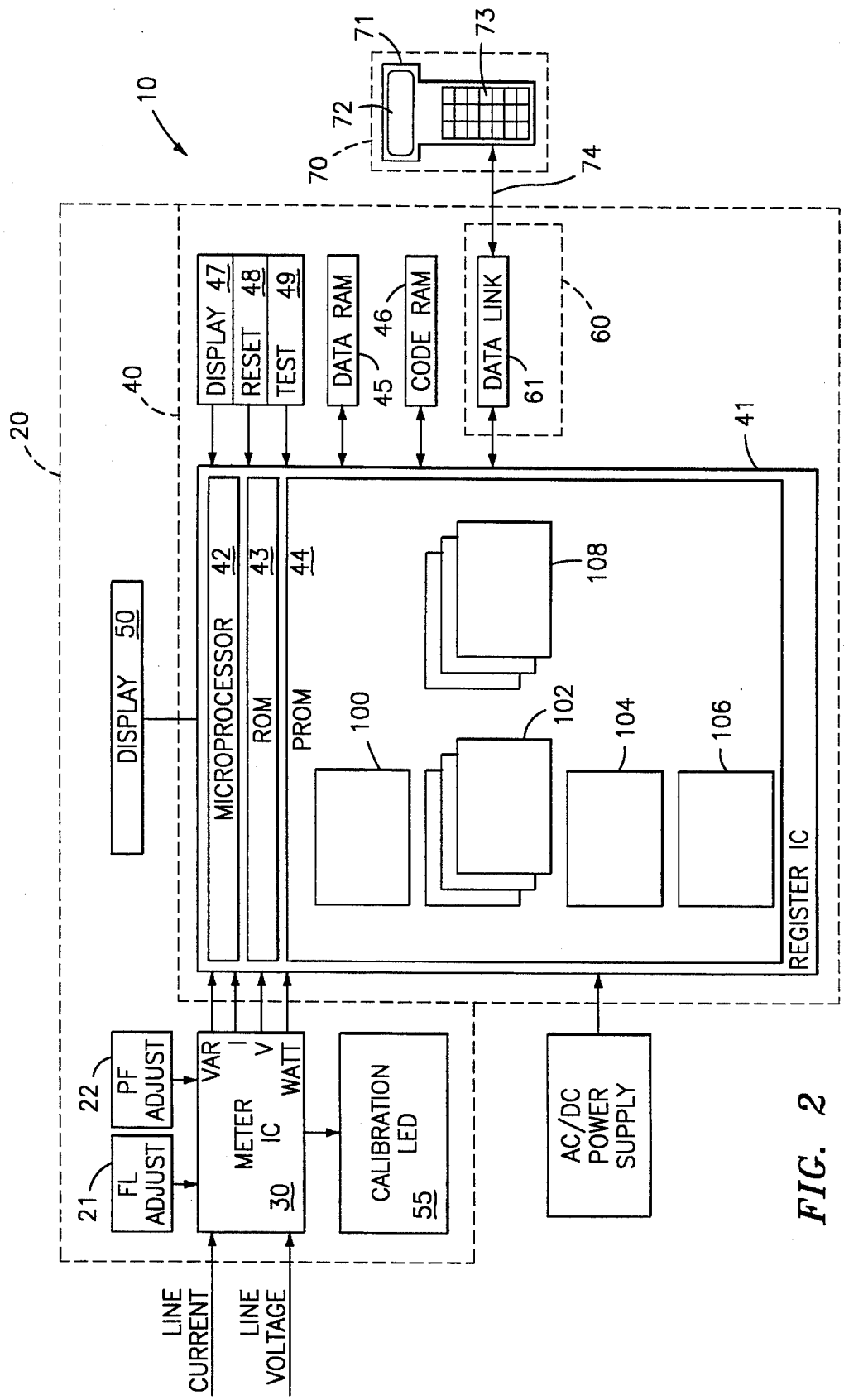
FIG. 2 is an electrical schematic representation of the recording system of FIG. 1.

Referring now to FIGS. 1–2, an electrical energy data recording system 10 is illustrated. The recording system 10 preferably includes an electrical energy meter 20 having a protective housing 22 (e.g. glass) and a meter integrated circuit 30 therein for sensing a line current and a line voltage and generating a plurality of meter output signals (e.g., I, V, Watt and Var) based on the sensed line current and the sensed line voltage. A programmable multi-channel load profile recorder 40 which is electrically connected to the meter integrated circuit 30, is also provided for, among other things, generating multiple channels of electrical energy metering quantities such as watt-hours (Wh), var-hours (Varh), volt$^2$-hours (V$^2$h), ampere$^2$-hours (I$^2$h), volt-ampere-hours (VAh) and power factor (PF). A display 50 preferably comprises a multi-segment liquid crystal alphanumeric display (LCD) at a face 24 of the meter 20, as illustrated. The liquid crystal display 50 can include a six character alphanumeric field 52, three digit numeric field 54, and annunciator segments and pulse and direction indicators (not shown).

The multi-channel load profile recorder 40 is preferably solid-state and includes a register integrated circuit 41 such as an application specific integrated circuit (ASIC). The recorder 40 also preferably includes data random-access memory 45 and code random-access memory 46 (RAM) for data storage and program memory, respectively. The RAM 46 may also include non-volatile RAM having battery backup. Display, reset and test switches 47–49, are also provided at the face 24 of the meter 20, as illustrated. The function of these switches is more fully described in copending and commonly assigned U.S. patent application Ser. No. 08/273,860, filed Jul. 12, 1994, now pending, entitled "Electrical Energy Meter Having Record of Meter Calibration Data Therein And Method of Recording Calibration Data", the disclosure of which is hereby incorporated herein by reference.

As will be understood by those skilled in the art, the ASIC 41 includes circuits for performing the metering quantity generating functions, display control functions, A/D conversion functions, non-volatile memory functions, etc. As illustrated, the ASIC 41 can include a microprocessor portion 42, a read-only memory (ROM) portion 43 and a non-volatile programmable read-only memory (PROM) portion 44. The PROM 44 is preferably formatted to retain a database of the electrical energy metering quantities.

A hand-held programming unit 70 is also provided for programming the recording register 40 and retrieving, among other things, the electrical energy metering quantities contained therein. The programming unit preferably includes a display 72, a data entry keypad 73 for entering data into the meter 20 and an optical/electrical data probe 74. The programming unit 70 is operatively connected to the ASIC 41 by interfacing means 60 which may include a serial data link 61 or may include an RF transceiver for transmitting and receiving radio-frequency signals to and from a remote source. Interfacing means 60 may also include a transceiver for transmitting and receiving informational carrier signals to and from a power line.

A preferred serial data link is an optical "OPTOCOM™" link, marketed by General Electric Company, Meter Division, Somersworth, N.H., although other serial data links such as a modulator/demodulator "modem" (connected to a telephone line or coaxial cable) may also be used. A communications port 62, such as an optical communications port, can also be provided at a face of the meter housing 22. Thus, interfacing means 60 is connected between the port 62 and the ASIC 41.

Figure 3:
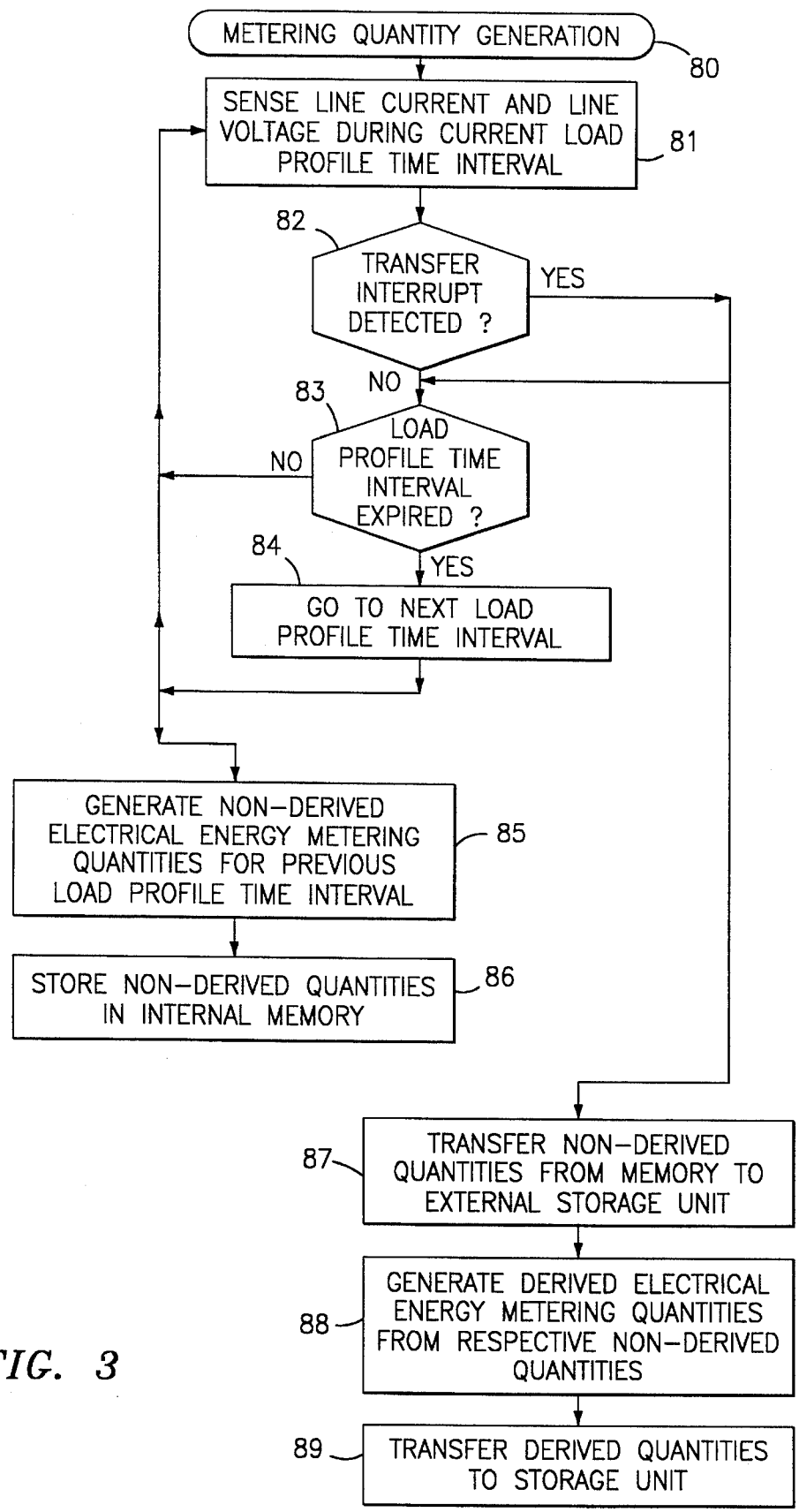
FIG. 3 is a flow-chart of steps corresponding to a preferred method of generating electrical energy metering quantities in a multi-channel load profile recorder.

Referring now to FIG. 3, a preferred method of generating electrical energy metering quantities 80 in the multi-channel load profile recorder 40, will be described. As illustrated by Block 81, the generation method 80 begins with the step of sensing a line quantity such as a line current and/or a line voltage transferred from an energy source (e.g., the power line) to an electrical load, during a load profile time interval. This time interval has a preselected length (e.g., 1–240 minutes) which can be preset by the manufacturer of the recorder 40 and/or programmed in the field by a utility operator. During the load profile time interval, a check is repeatedly performed in the "background" to determine whether a utility operator has accessed the meter 20, using the switches 47–49, and requested a transfer of a stored load profile record from the recorder to the external programming unit 70 via the serial data link 61, Block 82. If a transfer request has not been detected, no "background" action is taken by the ASIC 41 to generate metering quantities until the expiration of the current load profile time interval, Block 83. Once this occurs, the next interval automatically commences, Block 84, and then a plurality of non-derived electrical energy metering quantities (e.g., Wh, Varh, $V^2h$ and $I^2h$) are also generated during the next interval, Block 85, based on the sensed line quantities from the previous time interval. Once these quantities have been generated by the microprocessor 42, they are stored in internal memory (e.g., PROM 44), Block 86. As illustrated, these steps are repeated for each of the consecutive load profile time intervals, until the meter 20 is reset (or reprogrammed) or removed from the field for servicing.

At the expiration of a sufficient number of load profile time intervals, a utility operator may request a transfer of the currently stored load profile record, which has been accumulated since the last transfer request was generated, Block 82. These requests typically occur on a monthly basis while the meter is being read in the field by the utility operator. Alternatively, these requests may be made from the remote source using the transceiver or modem. Once a transfer request has been made, the accumulated record of non-derived quantities is downloaded from memory and transferred to an external programming unit 70, Block 87. This transfer step preferably occurs in the foreground while the time interval expiration step, Block 83, and other steps (e.g., Blocks 81, 84–86) are being performed in the background. At this time, the ASIC 41 performs operations to generate the derived electrical energy metering quantities (e.g., VAh, PF) from respective ones of the recorded non-derived quantities, and then these quantities are transferred to the external programming unit as well, Blocks 88–89.

For example, the number of volt-ampere-hours (VAh) for a particular time interval can be derived by taking the square-root of the sum of the squares of the stored volt$^2$-hours ($V^2h$) and ampere$^2$-hours ($I^2h$) metering quantities. Similarly, the power factor (PF) for a particular time interval can be derived by determining a quotient which equals the non-derived watt-hours (Wh) divided by the derived volt-ampere-hours (VAh). Furthermore, although steps 87–89 are shown as sequential steps, the are preferably performed contemporaneously by the ASIC 41. This means that steps 87–89 commence at the time the meter is accessed by the utility field operator or remote source and are performed during the meter reading operations. Alternatively, the order of the steps 87–89 may be changed. For example, the derived quantities may be generated and stored in random-access memory before the non-derived quantities are transferred, so that both the non-derived and derived quantities can be transferred together.

According to another embodiment of the present invention, each load profile time interval may also include multiple subintervals during which non-derived quantities are generated and temporarily stored in memory until the end of the load profile time interval. Once this occurs, a derived quantity may then be determined from the temporarily stored quantities and then these derived quantities may then be stored in non-volatile memory and/or displayed. According to this embodiment, the time interval of FIG. 3 may be treated as a subinterval; the interrupt may be automatically generated at the end of each load profile time interval; and the storage unit may be internal memory.

Thus, a multi-channel load profile recorder according to the present invention can generate a relatively large record of both non-derived and derived channels of electrical energy metering quantities, even though internal non-volatile memory is insufficient to store the quantities for both types of channels. Periodic retrieval of the load profile record by a utility operator can also be less frequent because a greater number of load profile intervals can be recorded before the memory capacity of the recorder is reached.

Figure 4B:
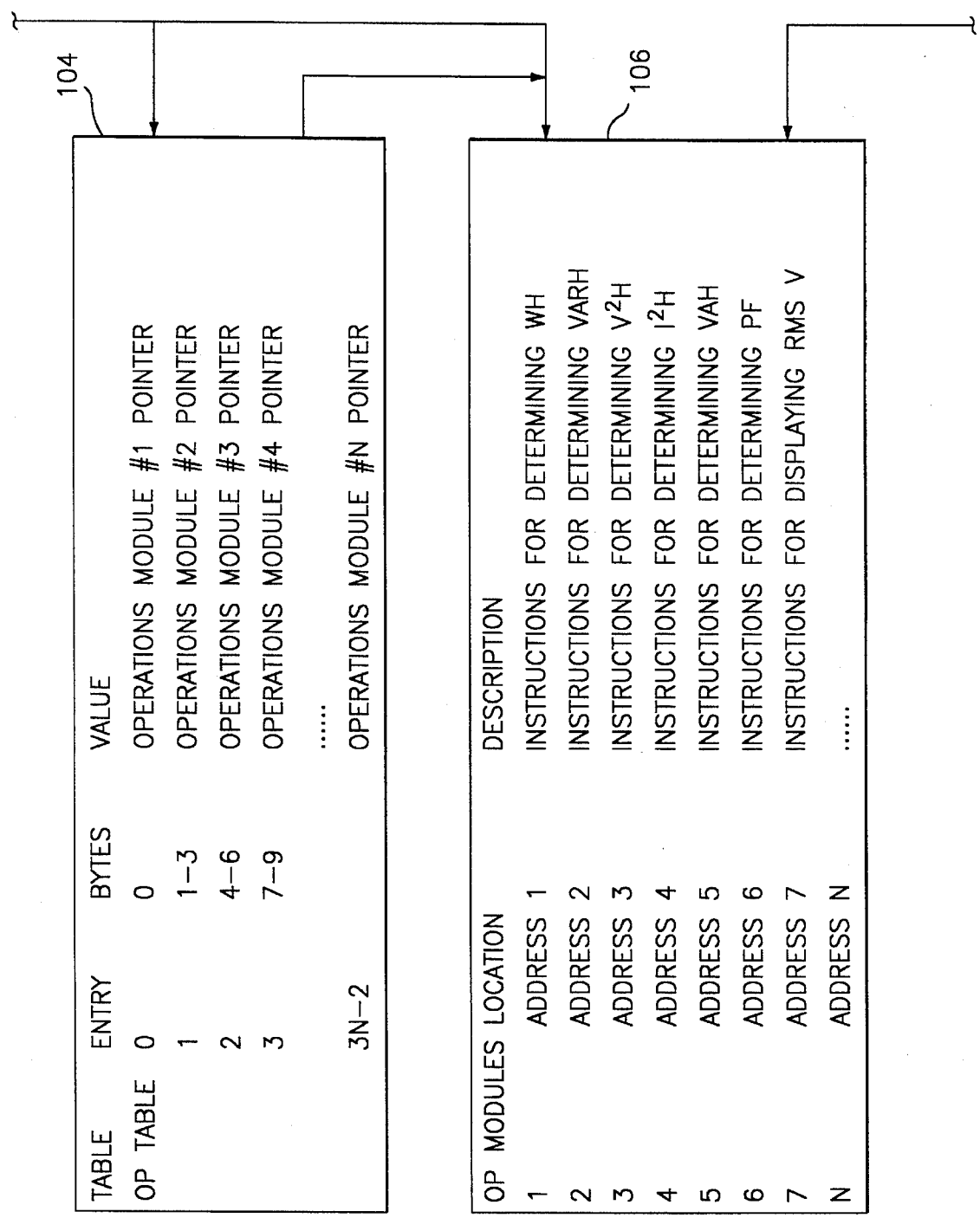

Referring now to FIG. 4A and FIG. 4B, a plurality of memory-based tables for a programmable multi-channel load profile recorder 40 will be described. The tables are preferably contained in non-volatile memory and this memory may be contained in the ASIC 41. In particular, FIG. 4A and FIG. 4B illustrate a load profile configuration table 100, a plurality of channel configuration tables (or sub-tables) 102, an operations table 104 and a plurality of display configuration tables 108 which are similar to the channel configuration tables 102. Each of these tables can be updated when the recorder is reprogrammed to record or display additional channels or reconfigured with new formulas.

As illustrated, the load profile configuration table 100 contains entries therein for each of a plurality of user-selected metering quantities to be recorded (e.g., Channels 1-N). These entries are preferably accessed in sequence by the microprocessor 42 at the end of each load profile time interval. These entries may contain pointers (i.e., addresses) to respective ones of the channel configuration tables 102 or the entries may incorporate the channel configuration tables as sub-tables. The channel configuration tables 102 and display configuration tables 108 contain entries for parameter data to be used in determining respective ones of the metering and display quantities, respectively. The entries may also contain the numeric parameters or pointers to those parameters in memory.

Each of the channel configuration tables 102 (and display configuration tables 108) also contain pointers to entries in the operations table 104 or pointers directly to respective ones of the operations modules 106 in memory. As illustrated, the operations modules 106 contain microprocessor-based instructions for determining the metering and display quantities based on user selected formulas. The entries of the channel and display configuration tables are also preferably accessed in sequence by the microprocessor 42, before the respective operations modules are executed. During this step, the entries (and numeric parameters) may be copied to RAM 45 and then retrieved from RAM 45 during execution of the modules. According to a preferred aspect of the present invention, each of the tables 100–108 can be readily updated based on externally supplied data at the time of the recorder is programmed. Thus, the recorder 40 need not contain built-in data for determining all the possible channel combinations which might be selected by a user during the life of the meter, or fixed formulas for determining all possible metering or display quantities.

The method of recording the plurality of metering quantities preferably includes the steps of accessing the load profile configuration table to determine the number of channels being recorded and obtain pointers the corresponding channel configuration tables. At the end of each load profile interval, the plurality of channel configuration tables then accessed by the microprocessor to obtain parameter data for the recorded channels and obtain pointers to entries in the operations table. These entries in the operations table are then accessed to obtain pointers to memory-based operations modules and then the instructions in the operations modules are executed so that the metering quantities can be determined based on the sensed line current, sensed line voltage and the parameter data.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A programmable multi-channel load profile recorder for use in connection with a metering unit which supplies metering quantities thereto, the metering quantities including watt-hours, said recorder comprising:

a processor;

data memory comprising a non-volatile random-access memory element and a programmable read-only memory element, said non-volatile random-access memory element configured to store the metering quantities supplied by the metering unit, said data memory coupled to said processor;

a data link for transferring data to an external unit upon receipt of a transfer request therefrom;

a plurality of memory-based tables stored in said programmable read-only memory element said memory-based tables comprising:

a load profile configuration table;

a plurality of channel configuration tables;

an operations table containing a plurality of entries therein; and a plurality of operation modules;

wherein said load profile configuration table comprises an entry therein for each of a plurality of preselected metering quantities to be derived and for retaining a pointer to one of the entries in one of the channel configuration tables;

wherein said plurality of channel configuration tables each comprise entries therein for retaining parameter data to be used in determining at least one of the plurality of preselected metering quantities to be derived and for retaining a pointer to one of the entries in said operations table, wherein the entries in said operations table retain pointers to at least one of said plurality of operation modules, and wherein said plurality of operation modules comprise instructions therein to be executed by said processor upon receipt of a transfer request so that the plurality of preselected metering quantities can be determined based at least in part on the metering quantities stored in said non-volatile random-access memory element.

2. The recorder of claim 1, wherein said processor comprises an integrated circuit.

3. The recorder of claim 1, wherein said parameter data includes length and format data for a respective parameter and a pointer to the respective parameter in said memory.

4. The recorder of claim 1, wherein the entries of said load profile configuration table include said plurality of channel configuration tables as sub-tables.

5. The recorder of claim 1, wherein the entries of said load profile configuration table include pointers to corresponding ones of said plurality of channel configuration tables.

6. The recorder of claim 1, further comprising at least one display configuration table comprising entries therein for retaining parameter data to be used in determining a displayable quantity and for retaining a pointer to one of the entries in said operations table.

7. The recorder of claim 6, wherein said processor is configured for accessing said at least one display configuration table and for displaying the displayable quantity based on the pointer in said at least one display configuration table.

8. A programmable multi-channel load profile recorder for use in connection with a metering unit which supplies metering quantities thereto, the metering quantities including watt-hours, said recorder, comprising:

a processor;

data memory comprising a non-volatile random-access memory element and a programmable read-only memory element, said non-volatile random-access memory element configured to store the metering quantities supplied by the metering unit, said data memory coupled to said processor;

a data link for transferring data to an external unit upon receipt of a transfer request therefrom;

a plurality of memory-based tables stored in said programmable read-only memory element said memory-based tables comprising:

a load profile configuration table; a plurality of channel configuration tables; and a plurality of operation modules;

wherein said load profile configuration table comprises an entry therein for each of a plurality of preselected metering quantities to be derived and for retaining a pointer to one of the entries in one of the channel configuration tables, wherein said plurality of channel configuration tables each comprise entries therein for retaining parameter data to be used in determining at least one of the plurality of preselected metering quantities to be derived and for retaining a pointer to at least one of said plurality of operation modules, and wherein said plurality of operation modules comprise instructions therein to be executed by said processor upon receipt of a transfer request so that the plurality of preselected metering quantities can be determined based at least in part on the metering quantities stored in said non-volatile random-access memory element.

9. The recorder of claim 8, wherein said processor comprises an integrated circuit.

10. The recorder of claim 8, wherein said parameter data includes length and format data for a respective parameter and a pointer to the respective parameter in said memory.

11. The recorder of claim 8, wherein the entries of said load profile configuration table include said plurality of channel configuration tables as sub-tables.

12. The recorder of claim 8, wherein the entries of said load profile configuration table include pointers to corresponding ones of said plurality of channel configuration tables.

13. The recorder of claim 8, further comprising at least one display configuration table comprising entries therein for retaining parameter data to be used in determining a displayable quantity and for retaining a pointer to at least one of said plurality of operations modules.

14. The recorder of claim 8, wherein said processor is configured for accessing said at least one display configuration table and for displaying the displayable quantity based on the pointer in said at least one display configuration table.

15. A method of recording a plurality of electrical energy metering quantities in a multi-channel load profile recorder, the recorder including a processor, data memory including a non-volatile random-access memory element and a programmable read-only memory element, the non-volatile random-access memory element configured to store metering quantities supplied by the metering unit, the data memory coupled to said processor, the recorder further including a data link for transferring data to an external unit upon receipt of a transfer request therefrom and a plurality of memory-based tables stored in the programmable read-only memory element said memory-based tables, the method comprising the steps of:

accessing a plurality of channel configuration tables, contained in the programmable memory of the recorder, to obtain parameter data corresponding to each of the plurality of electrical energy metering quantities to be recorded and obtain pointers to entries in an operations table contained in the programmable memory;

accessing the operations table to obtain pointers to operation modules in the programmable memory which contain instructions therein; and controlling the processor to execute the instructions in the operation modules upon receipt of a transfer request to derive the plurality of electrical energy metering quantities.

16. The method of claim 15, wherein said plurality of channel configuration tables accessing step comprises the step of accessing the plurality of channel configuration tables to obtain pointers to parameters located in the programmable memory.

* * * * *